US011558963B2

(12) United States Patent
Dickerhoof et al.

(10) Patent No.: US 11,558,963 B2
(45) Date of Patent: *Jan. 17, 2023

(54) ELECTRICAL ASSEMBLY

(71) Applicant: Lear Corporation, Southfield, MI (US)

(72) Inventors: Greg Dickerhoof, Ann Arbor, MI (US); Matthew Zamieski, Clinton Township, MI (US); Aric Anglin, Jackson, MI (US); Robert M. Schmidt, Livonia, MI (US); Rutunj Rai, Canton, MI (US)

(73) Assignee: Lear Corporation, Southfield, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/395,082

(22) Filed: Aug. 5, 2021

(65) Prior Publication Data

US 2021/0378102 A1  Dec. 2, 2021

Related U.S. Application Data

(63) Continuation-in-part of application No. 17/223,728, filed on Apr. 6, 2021, which is a continuation-in-part
(Continued)

(51) Int. Cl.
*H05K 1/18* (2006.01)
*H01H 50/12* (2006.01)
(Continued)

(52) U.S. Cl.
CPC ............ *H05K 1/189* (2013.01); *H01H 50/12* (2013.01); *H01H 50/14* (2013.01); *H01R 12/65* (2013.01);
(Continued)

(58) Field of Classification Search
CPC .. H05K 1/189; H05K 3/3447; H05K 7/20009; H05K 2201/09754;
(Continued)

(56) References Cited

U.S. PATENT DOCUMENTS 2,984,080 A   5/1961   Sliepcevich
5,504,378 A   4/1996   Lindberg et al.
(Continued)

FOREIGN PATENT DOCUMENTS

CN    105609366 A    5/2016
CN    107579385 A    1/2018
JP    5621882 B2    11/2014

OTHER PUBLICATIONS

Chinese Office Action dated Dec. 9, 2021 related to Chinese Patent Application No. 201911043389.7.

*Primary Examiner* — Harshad C Patel
(74) *Attorney, Agent, or Firm* — Fishman Stewart PLLC

(57) ABSTRACT

An electrical assembly may include a contactor, a bus bar connected to the contactor, a bracket connected to the bus bar, a flexible circuit electrically connected to the contactor, and/or a cooling member connected to the bracket. A method of assembling an electrical assembly may include disposing a flexible circuit at least partially on and/or in the bracket, connecting a bus bar with the one or more contactors, connecting the bus bar with the bracket, electrically connecting the flexible circuit to the one or more contactors, disposing a cooling member on or about the bracket, and/or connecting the cooling member with the bracket.

18 Claims, 11 Drawing Sheets

Related U.S. Application Data of application No. 16/592,126, filed on Oct. 3, 2019, now Pat. No. 10,971,873, and a continuation-in-part of application No. 17/071,588, filed on Oct. 15, 2020.

(60) Provisional application No. 62/753,383, filed on Oct. 31, 2018, provisional application No. 62/915,568, filed on Oct. 15, 2019.

(51) Int. Cl.
  *H01H 50/14* (2006.01)
  *H01R 12/65* (2011.01)
  *H05K 3/34* (2006.01)
  *H05K 7/20* (2006.01)

(52) U.S. Cl.
  CPC ....... *H05K 3/3447* (2013.01); *H05K 7/20009* (2013.01); *H05K 7/20272* (2013.01); *H05K 2201/09754* (2013.01); *H05K 2201/10053* (2013.01)

(58) Field of Classification Search
  CPC ......... H05K 2201/10053; H01H 50/12; H01H 50/14; H01R 12/50; H01R 12/65; H01R 12/59
  See application file for complete search history.

(56) References Cited

U.S. PATENT DOCUMENTS

| | | | |
|---|---|---|---|
| 5,567,991 A | 10/1996 | Schantz et al. | |
| 6,198,630 B1 | 3/2001 | Cromwell | |
| 6,236,566 B1 | 5/2001 | Regnier et al. | |
| 6,916,122 B2 | 7/2005 | Branch et al. | |
| 7,164,584 B2 | 1/2007 | Walz | |
| 7,315,448 B1 | 1/2008 | Bash et al. | |
| 7,371,965 B2 | 5/2008 | Ice | |
| 7,393,236 B2 | 7/2008 | Thompson et al. | |
| 7,453,695 B2 | 11/2008 | Ohnishi et al. | |
| 7,837,496 B1 * | 11/2010 | Pal | H01R 9/2466 |
| | | | 439/485 |
| 8,520,386 B2 | 8/2013 | Bott et al. | |
| 8,552,824 B1 | 10/2013 | Pal | |
| 8,597,785 B2 | 12/2013 | Komiyatani et al. | |
| 9,137,925 B2 * | 9/2015 | Pal | H02B 1/56 |
| 9,142,364 B2 * | 9/2015 | Pal | H01H 1/62 |
| 9,153,946 B2 | 10/2015 | Pal | |
| 9,313,930 B2 | 4/2016 | Goth et al. | |
| 9,855,903 B1 | 1/2018 | Pal | |
| 9,930,789 B2 | 3/2018 | Low | |
| 9,991,655 B2 | 6/2018 | Pal | |
| 10,057,974 B2 | 8/2018 | Pal | |
| 10,270,231 B2 * | 4/2019 | Pal | H01H 50/12 |
| 10,523,094 B2 | 12/2019 | Wang et al. | |
| 10,919,465 B2 | 2/2021 | Takamatsu et al. | |
| 2002/0127904 A1 | 9/2002 | Aoki | |
| 2006/0120001 A1 | 6/2006 | Weber et al. | |
| 2011/0206948 A1 | 8/2011 | Asai et al. | |
| 2014/0087584 A1 | 3/2014 | Pal | |
| 2014/0176270 A1 | 6/2014 | Temnykh | |
| 2016/0028216 A1 * | 1/2016 | Pal | H01H 85/47 |
| | | | 361/676 |
| 2016/0172126 A1 | 6/2016 | Pal et al. | |
| 2017/0076877 A1 | 3/2017 | Pal | |
| 2017/0279250 A1 | 9/2017 | Pal | |
| 2018/0009399 A1 | 1/2018 | Pal | |
| 2018/0132343 A1 * | 5/2018 | Pal | H01H 1/62 |
| 2018/0330906 A1 | 11/2018 | Hiramitsu et al. | |
| 2018/0366922 A1 | 12/2018 | Pal et al. | |
| 2019/0214799 A1 | 7/2019 | Pal et al. | |
| 2020/0136326 A1 | 4/2020 | Rai et al. | |

\* cited by examiner

ELECTRICAL ASSEMBLY

CROSS-REFERENCE TO RELATED APPLICATION

This application is a continuation-part-application of U.S. patent application Ser. No. 17/223,738, filed Apr. 6, 2021, which is (i) a continuation-in-part application of U.S. patent application Ser. No. 16/592,126, filed Oct. 3, 2019, now U.S. Pat. No. 10,971,873, which claims the benefit of U.S. Provisional Patent Application Ser. No. 62/753,383, filed on Oct. 31, 2018, and (ii) a continuation-in-part application of U.S. patent application Ser. No. 17/071,588, filed Oct. 15, 2020, which claims the benefit of U.S. Provisional Patent Application Ser. No. 62/915,568, filed on Oct. 15, 2019.

The disclosures of all of the foregoing are hereby incorporated by reference in their entireties as though fully set forth herein.

TECHNICAL FIELD

The present disclosure generally relates to electrical assemblies, including assemblies that may include electrical contactors and/or flexible circuits that may, for example, be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies do not provide sufficient functionality, are not configured for use with large electrical currents, do not provide sufficient cooling (e.g., that may be associated with large electrical currents), and/or require complicated assembly processes.

There is a desire for solutions/options that minimize or eliminate one or more challenges or shortcomings of electrical assemblies. The foregoing discussion is intended only to illustrate examples of the present field and is not a disavowal of scope.

SUMMARY

In embodiments, an electrical assembly may include a contactor, a bus bar connected to the contactor, a bracket connected to the bus bar, a flexible circuit electrically connected to the contactor, and/or a cooling member connected to the bracket.

With embodiments, a method of assembling an electrical assembly may include disposing the flexible circuit at least partially on and/or in the bracket, connecting a bus bar with the one or more contactors, connecting the bus bar with the bracket, electrically connecting the flexible circuit to the one or more contactors, disposing a cooling member on or about the bracket, and/or connecting the cooling member with the bracket.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
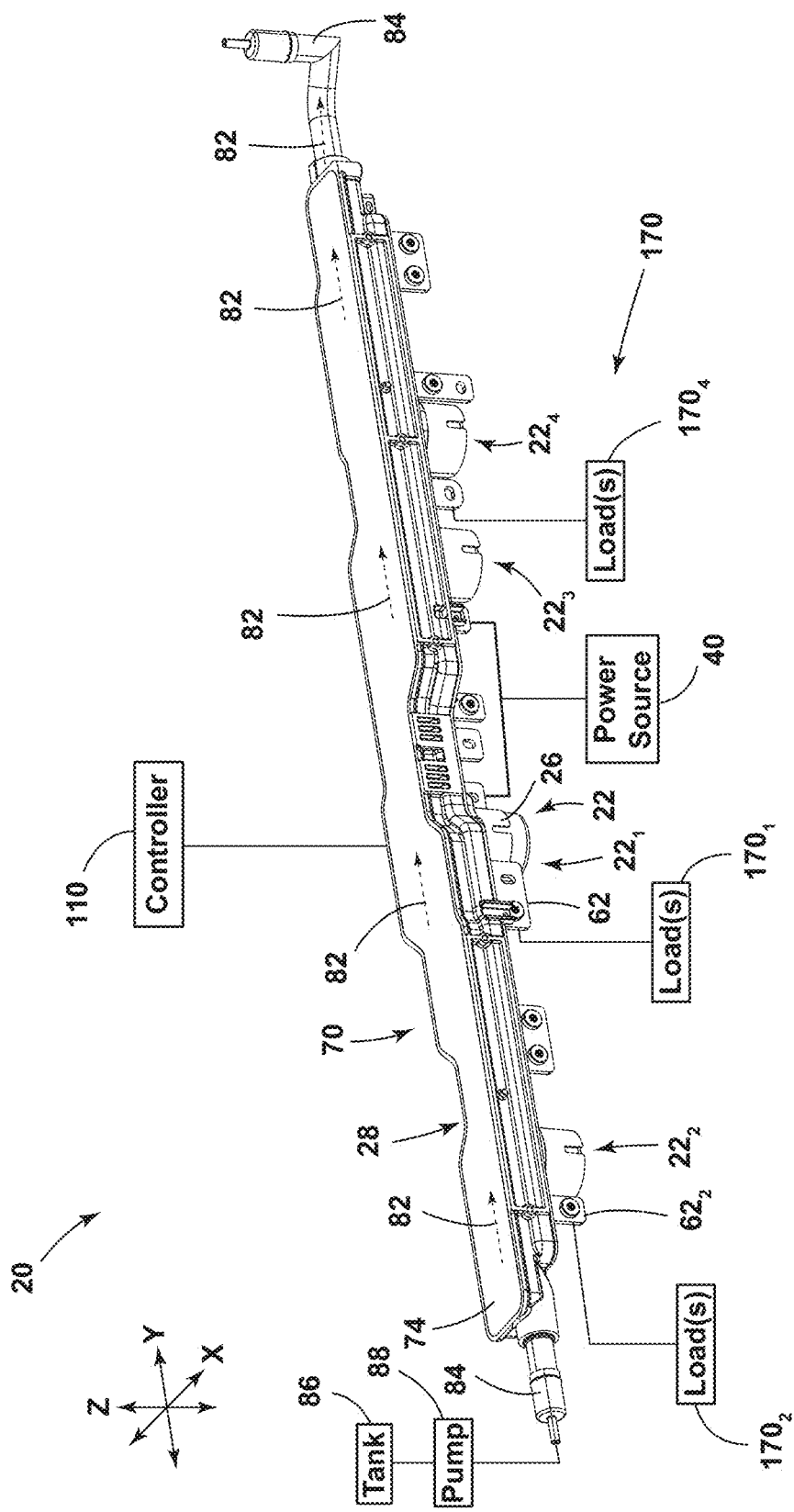
FIG. 1 is a perspective view generally illustrating an embodiment of an electrical assembly.
Figure 2:
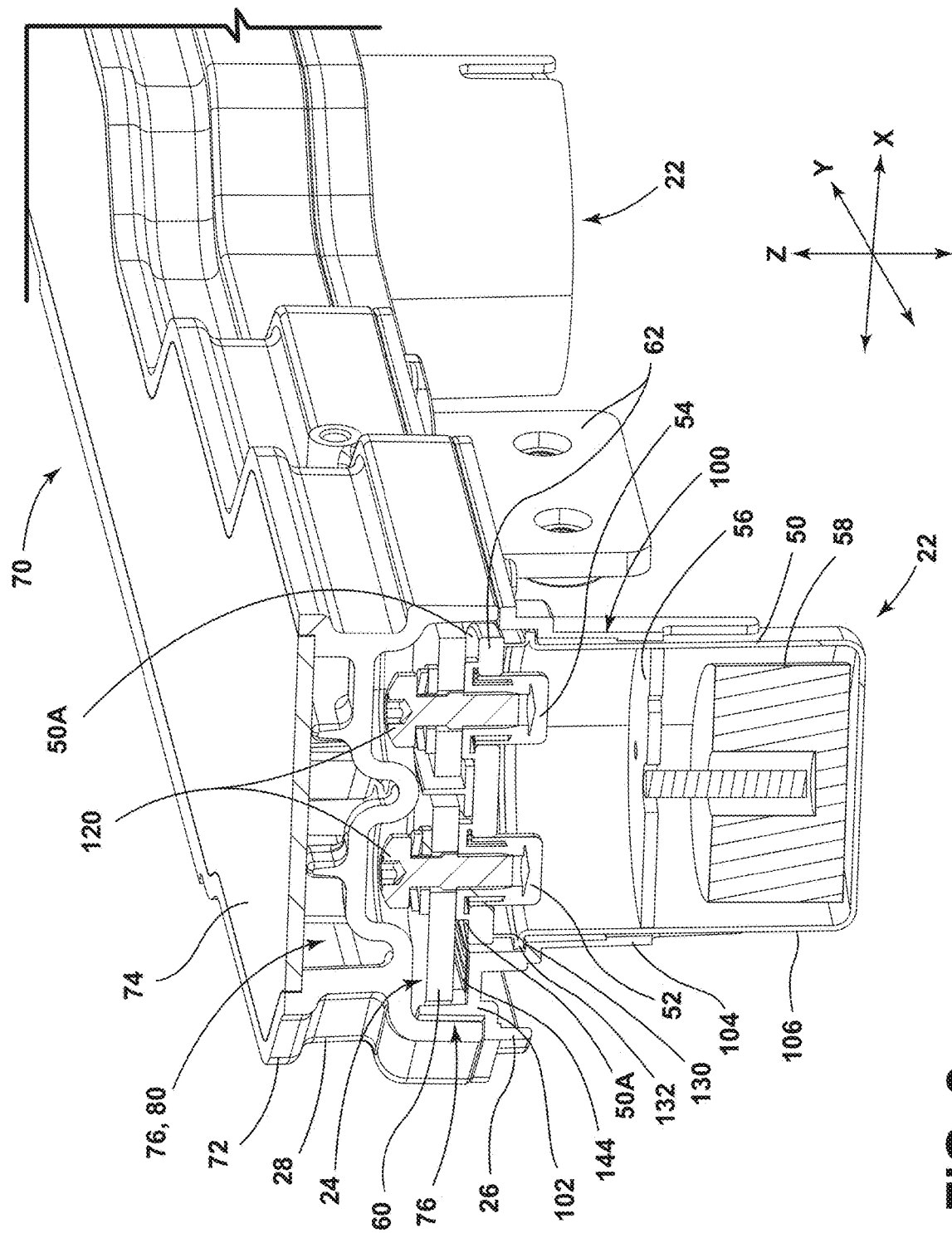
FIG. 2 is a cross-sectional perspective view generally illustrating an embodiment of an electrical assembly.

In embodiments, such as generally illustrated in FIGS. 1 and 2, an electrical assembly 20 may include one or more contactors 22 (or relays, electrical switches, etc.), such as first contactor $22_1$, a second contactor $22_2$, a third contactor $22_3$, and/or a fourth contactor $22_4$, a bus bar assembly 24 (see FIG. 2), a bracket 26, and/or a cooling member 28. Electrical currents flowing through the bus bar assembly 24 and/or the contactor(s) 22 may generate or result in a large amount of heat. For example and without limitation, an electrical assembly 20 and/or the contactors 22 may be configured for use with currents of at least 500 Amps (e.g., for several minutes or more), at least 1000 Amps, and/or at least 2500 Amps (e.g., for at least 10-15 seconds). The cooling member 28 may be configured to facilitate dissipation of at least some of the generated heat.

In embodiments, such as generally illustrated in FIG. 2, a contactor 22 may include an outer wall 50, a first contactor terminal 52, a second contactor terminal 54, an electrically conductive contact member 56 configured to selectively electrically connect the first terminal 52 and the second terminal 54, and/or actuator 58. An actuator 58 may be configured to change the contactor 22 from an inactive/open state in which the contact member 56 does not electrically connect the first terminal 52 and the second terminal 54, and an active/closed state in which the contact member 56 does electrically connect the first terminal 52 and the second terminal 54. An actuator 58 may, for example and without limitation, include an electromagnet, a coil, and/or a solenoid configured to move the contact member 56 into and out of electrical contact with the terminals 52, 54.

With examples, such as generally illustrated in FIG. 1, a bus bar assembly 24 may be electrically connected to one or contactors 22, a power source 40 (e.g., a battery, an outlet, etc.), and/or one or more electrical loads 170. A bus bar assembly 24 may include a first bus bar 60 and/or one or more second bus bars 62 (e.g., second bus bar $62_1$, $62_2$, $62_3$, $62_4$) (see, e.g., FIG. 3). The first bus bar 60 may be electrically connected to some or all of the contactors 22 and/or the power source 40. For example, the first bus bar 60 may be connected (e.g., directly) to the first terminals 52 of the contactor(s) 22 and may be connected to the power source 40, at least indirectly, to provide current from the power source 40 to the contactor(s) 22. In some configurations, the first bus bar 60 may include a first portion 60A that may be connected to the first terminals 52 of the first and second contactors $22_{1,2}$ and/or may include a second portion 60B that may be connected to the first terminals 52 of the third and fourth contactors $22_{3,4}$. The first portion 60A and the second portion 60B may be separate or internally formed. A respective second bus bar 62 may be connected to a second terminal 54 of one or more contactors 22. The second bus bars 62 may electrically connect a contactor 22 to a respective load 170 (e.g., loads $170_1$, $170_2$, $170_3$, $170_4$). A load 170 may, for example and without limitation, include a single load or a plurality of loads, such as one or more vehicle systems or components (e.g., air conditioner, heater, electric motor, etc.).

Figure 3:
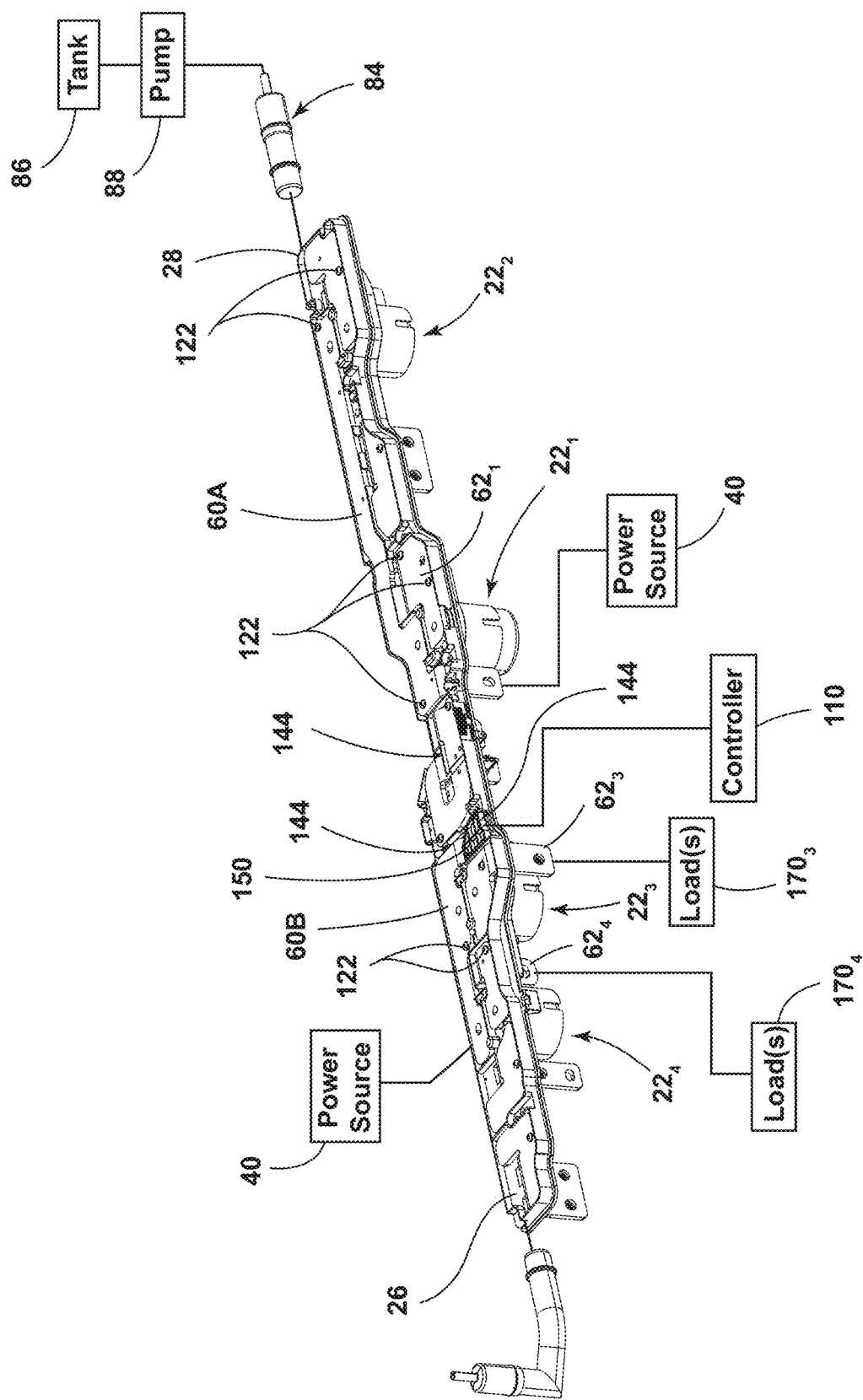
FIG. 3 is a cross-sectional perspective view generally illustrating an embodiment of an electrical assembly.
Figure 4:
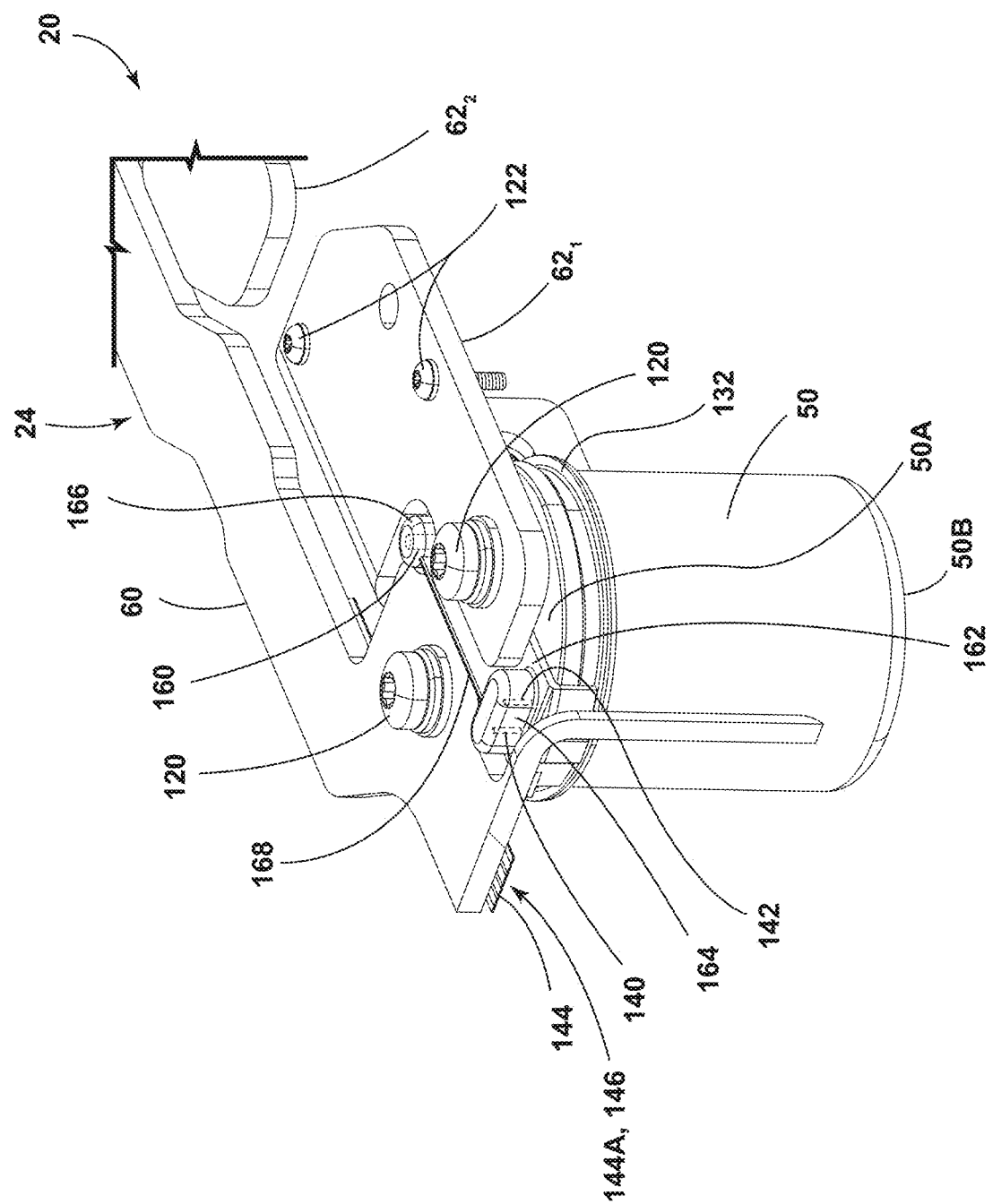
FIG. 4 is a partial perspective view generally illustrating an embodiment of an electrical assembly in which a bracket and a cooling member are hidden.

In embodiments, such as generally illustrated in FIGS. 2-4, a bus bar assembly 24 may, for example, be disposed, at least in part, directly on one or more contactors 22. For example and without limitation, the first bus bar 60 may be disposed directly on the outer wall 50 and/or the first terminal 52 of a contactor 22. A second bus bar 62 may be disposed directly on an outer wall 50 and/or a second terminal 54 of a contactor 22.

In examples, such as generally illustrated in FIGS. 1 and 2, a cooling member 28 may be configured for active cooling (e.g., as an active cooling member). The cooling member 28 may include a body 70 (e.g., a cold plate) having a first portion/member 72 and a second portion/member 74. The first portion 72 and the second portion 74 may be separate/independent (e.g., separate monolithic components) and may be configured to be connected together. The first portion 72 may be configured as a body and the second portion 74 may be configured as a cover. For example and without limitation, the first portion 72 may include a first recess 76 disposed in a first (e.g., top) surface and the second portion 74 may be configured to cover the first recess 76 such that the first recess 76 and the second portion 74 may function as and/or provide a fluid passage 80 (see, e.g., FIG. 2). The first recess 76 may, for example, extend along substantially all of the length of the cooling member 28. The fluid passage 80 may be configured to receive a cooling fluid 82 (e.g., water, glycol, air, etc.) and/or a fluid conduit 84 (e.g., a pipe, tube, etc.) for the cooling fluid 82. The fluid passage 80 and/or the fluid conduit 84 may be connected to a fluid reservoir/tank 86 of cooling fluid 82 and/or a pump 88 that may pump the cooling fluid 82, such as from the fluid reservoir 86, through the cold plate 70 to dissipate heat from the electrical assembly 20 (see, e.g., FIG. 1).

Figure 6:
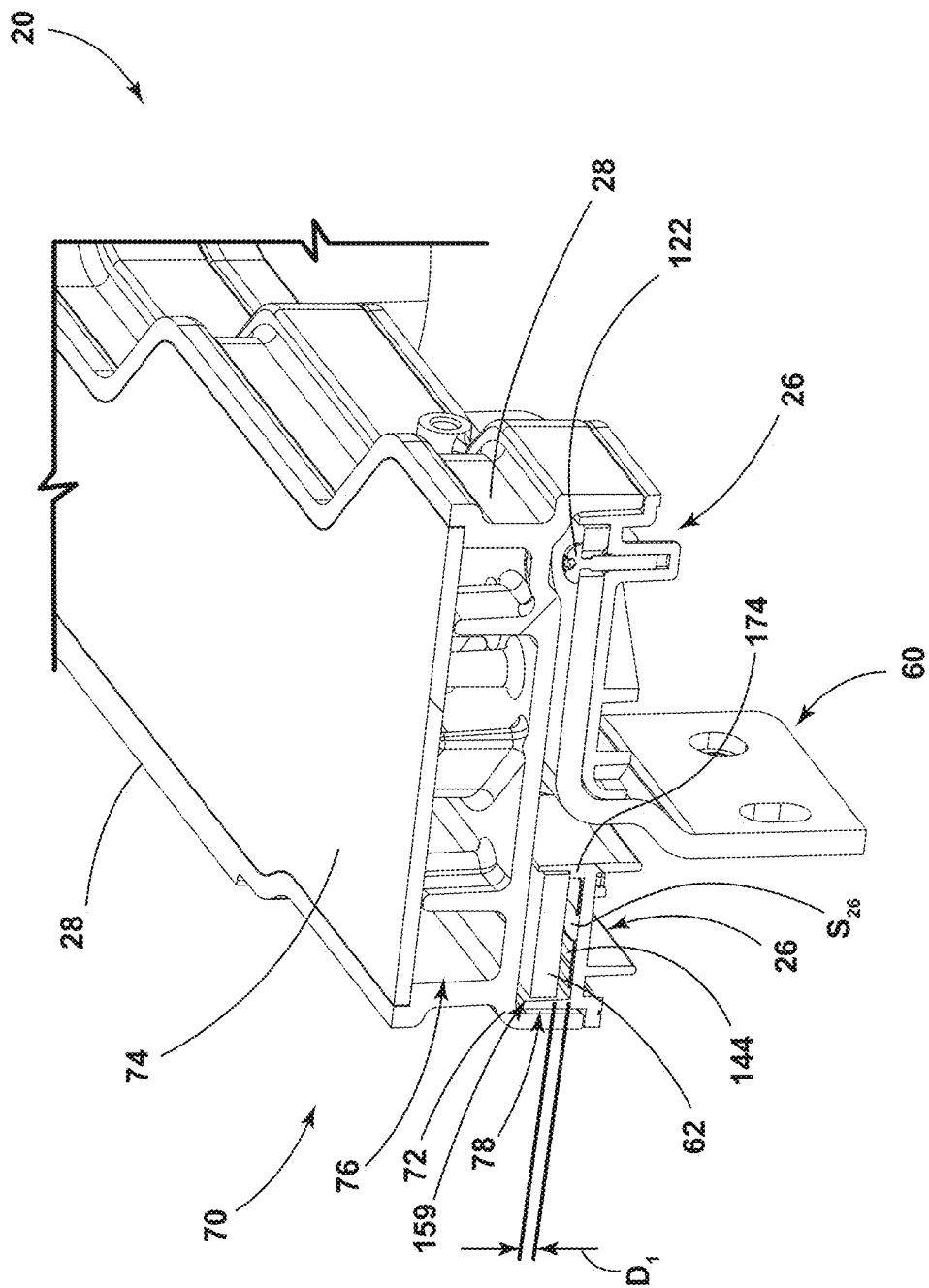
FIG. 6 is a partial perspective view generally illustrating an embodiment of an electrical assembly.
Figure 7:
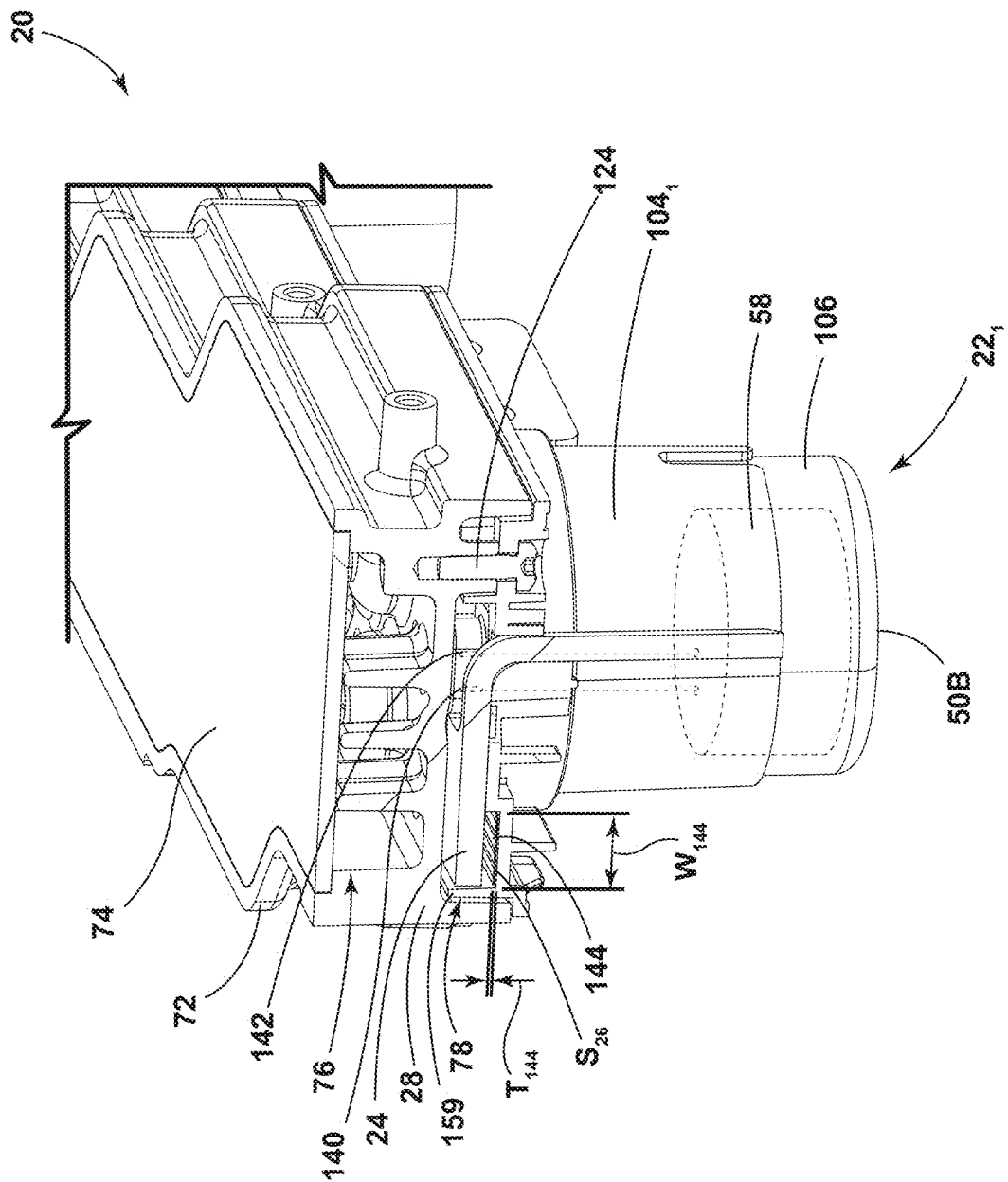
FIG. 7 is a cross-sectional perspective view generally illustrating an embodiment of an electrical assembly.

In embodiments, such as generally illustrated in FIGS. 2, 6, and 7, a cooling member 28 may include a second recess 78 that may be disposed opposite the first recess 76 (e.g., the first recess 76 and the second recess 78 may open in opposite directions). The second recess 78 may be configured to at least partially receive one or more contactors 22, a bus bar assembly 24, a bracket 26, and/or a flexible circuit 144. The second recess 78 may, for example, extend along substantially all of the length of the cooling member 28. The first recess 76 and/or the second recess 78 of the cooling member 28 may provide the cooling member 28 and/or the body 70 with an at least partially hollow configuration and/or a generally H-shaped cross-sectional shape.

Figure 5:
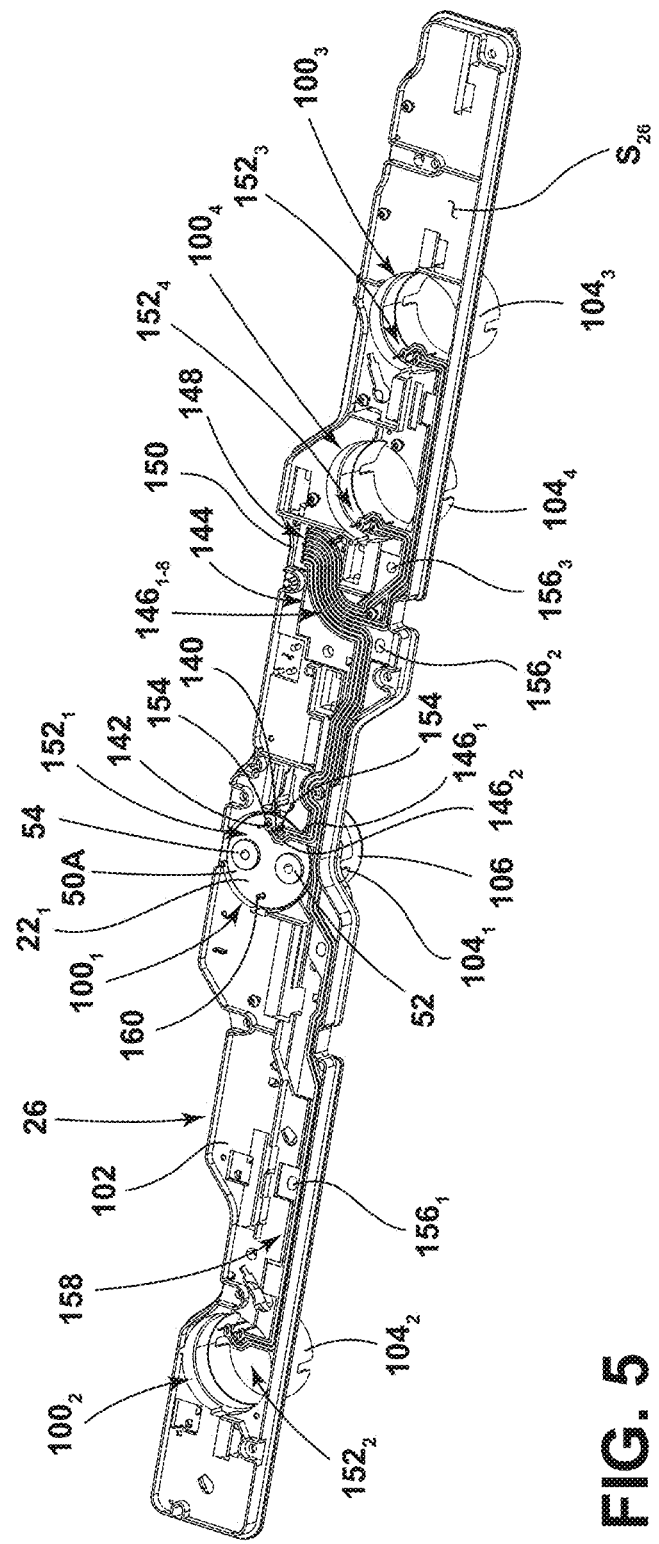
FIG. 5 is a perspective view generally illustrating embodiments of a bracket, a contactor, and a flexible circuit of an embodiment of an electrical assembly.

With embodiments, such as generally illustrated in FIGS. 1 and 5, a bracket 26 may be configured to connect a cooling member 28 with one or more contactors 22, such as via a bus bar assembly 24. A bracket 26 may include one or more of a variety of shapes, sizes, materials, and/or configurations. For example and without limitation, the bracket 26 may include plastic and/or one or more electrically insulating materials, and may include a generally elongated rectangular frame configuration. A bracket 26 may include one or more apertures 100 (e.g., apertures $100_1$, $100_2$, $100_3$, $100_4$) that may be configured to at least partially receive a contactor 22 (see, e.g., FIG. 5). For example and without limitation, a bracket 26 may include apertures $100_{1-4}$ for contactors $22_{1-4}$. An aperture 100 may be configured as a through aperture that may extend through the bracket 26. The bracket 26 may include one or more sleeve portions 104 (e.g., sleeve portions $104_{1-4}$) that may extend from a body 102 of the bracket 26 and that may at least partially define the one or more apertures 100. A sleeve portion 104 may be configured to limit movement (e.g., tilting, X-movement, Y-movement, etc.) of a contactor 22. A shape of at least some of a sleeve portion 104 may, for example, generally correspond to a shape at least some of a contactor 22. For example and without limitation, a sleeve portion 104 may include a generally cylindrical configuration if a contactor 22 includes a generally cylindrical configuration, and/or a sleeve portion 104 may include a generally rectangular configuration if a contactor 22 includes a generally rectangular configuration. Some sleeve portions 104 may be shorter (e.g., in an axial/Z-direction) than a contactor 22 such that the sleeve portion 104 covers some of the outer wall 50 of a contactor 22 and an exposed portion 106 of the outer wall 50 is not covered by the sleeve portion 104 (see, e.g., contactor $22_1$). The exposed portion 106 may, for example, include a side (e.g., an outer radial surface) of the outer wall 50, be disposed proximate a second (e.g., bottom) end of the contactor 22, include a second/bottom surface 50B of the contactor 22, and/or extend around some or all of a perimeter/circumference of the contactor 22.

In embodiments, other sleeve portions 104 may be about the same length as or longer than a contactor 22 such that the sleeve portion 104 and the body 102 may substantially cover a side surface (e.g., an outer radial surface) of the outer wall 50 (see, e.g., contactors $22_{2-4}$). The body 102 and the sleeve portions 104 may not cover first surfaces 50A (e.g., top axial surfaces) of the contactors 22 and/or may not cover second surfaces 50B (e.g., bottom axial surfaces) of the contactors 22, which may facilitate cooling. For example and without limitation, the outer wall 50, the second surfaces 50B, and/or the exposed portion 106 of a contactor 22 may comprise metal (e.g., steel) and ambient air may flow past the second surfaces 50B and/or the exposed portion 106, which may provide cooling/heat dissipation, at least to some degree. In contrast, some other contactor designs include a plastic housing (e.g., a thermally insulating housing) that covers all of a contactor, limiting cooling/heat dissipation.

With embodiments, such as generally illustrated in FIGS. 2, 4, 6, and 7, one or more contactors 22, a bus bar assembly 24, a bracket 26, and/or a cooling member 28 may be connected together (e.g., mechanically). The one or more contactors 22 may be connected to the bus bar assembly 24. For example and without limitation, the one or more contactors 22 may be fixed (e.g., bolted/screwed) to a first bus bar 60 and a second bus bar 62 via one or more first fasteners 120 (see, e.g., FIGS. 2 and 4). Connection between the bus bar assembly 24 (e.g., bus bars 60, 62) and the contactor(s) 22 may provide and/or facilitate an electrical connection between the bus bars 60, 62 and the contactors 22. In embodiments, such as generally illustrated in FIG. 6, the bus bar assembly 24 may be connected to the bracket 26. For example and without limitation, the bus bars 60, 62 may be fixed (e.g., bolted/screwed) to the bracket 26 via one or more second fasteners 122 that may be inserted into the bus bars 60, 62 and then down into a top of the bracket 26. With embodiments, such as generally illustrated in FIG. 7, the bracket 26 may be connected to the cooling member 28. For example and without limitation, the bracket 26 may be fixed (e.g., bolted/screwed) to the cooling member 28 via one or more third fasteners 124 that may be inserted into the bracket 26 and then up into a bottom of the cooling member 28. A fastener 120, 122, 124 may, for example and without limitation, include a screw, a bolt, and/or a rivet, among others.

In some embodiments, the one or more contactors 22 may, for example, be directly fixed to the bus bar assembly 24, may be indirectly fixed to the bracket 26 via the bus bar assembly 24, and/or may be indirectly fixed to the cooling member 28 via the bus bar assembly 24 and the bracket 26. The one or more contactors 22 may, for example and without limitation, not be fixed directly to the bracket 26 and/or the cooling member 28. The bus bar assembly 24 may be directly fixed to the bracket 26 and/or may be indirectly fixed to the cooling member 28 via the bracket 26. The bus bar assembly 24 may, for example and without limitation, not be fixed directly to the cooling member 28.

With embodiments, such as generally illustrated in FIG. 2, an aperture 100 of a bracket 26 may include a lip 130 (e.g., axial surface) that may be configured to contact a contactor 22. For example, an outer wall 50 of a contactor 22 may include a flange 132 that may extend outward (e.g., radially outward), and the contactor 22 may be inserted into the aperture 100 until the flange 132 contacts the lip 130. The lip 130 may at least temporarily support the contactor 22, such as until the contactor 22 is connected with the bus bar assembly 24.

In embodiments, a controller 110 may be configured to control the contactors 22 to selectively provide power from a power source 40 to one or more electrical loads 170 (see, e.g., FIGS. 1 and 3). For example and without limitation, the controller 110 may be configured to generate one or more control signals to control operation of an actuator 58 of a contactor 22 to selectively open and close the contactor 22, which may selectively provide power from the power source 40 to the one or more electrical loads 170.

Figure 8:
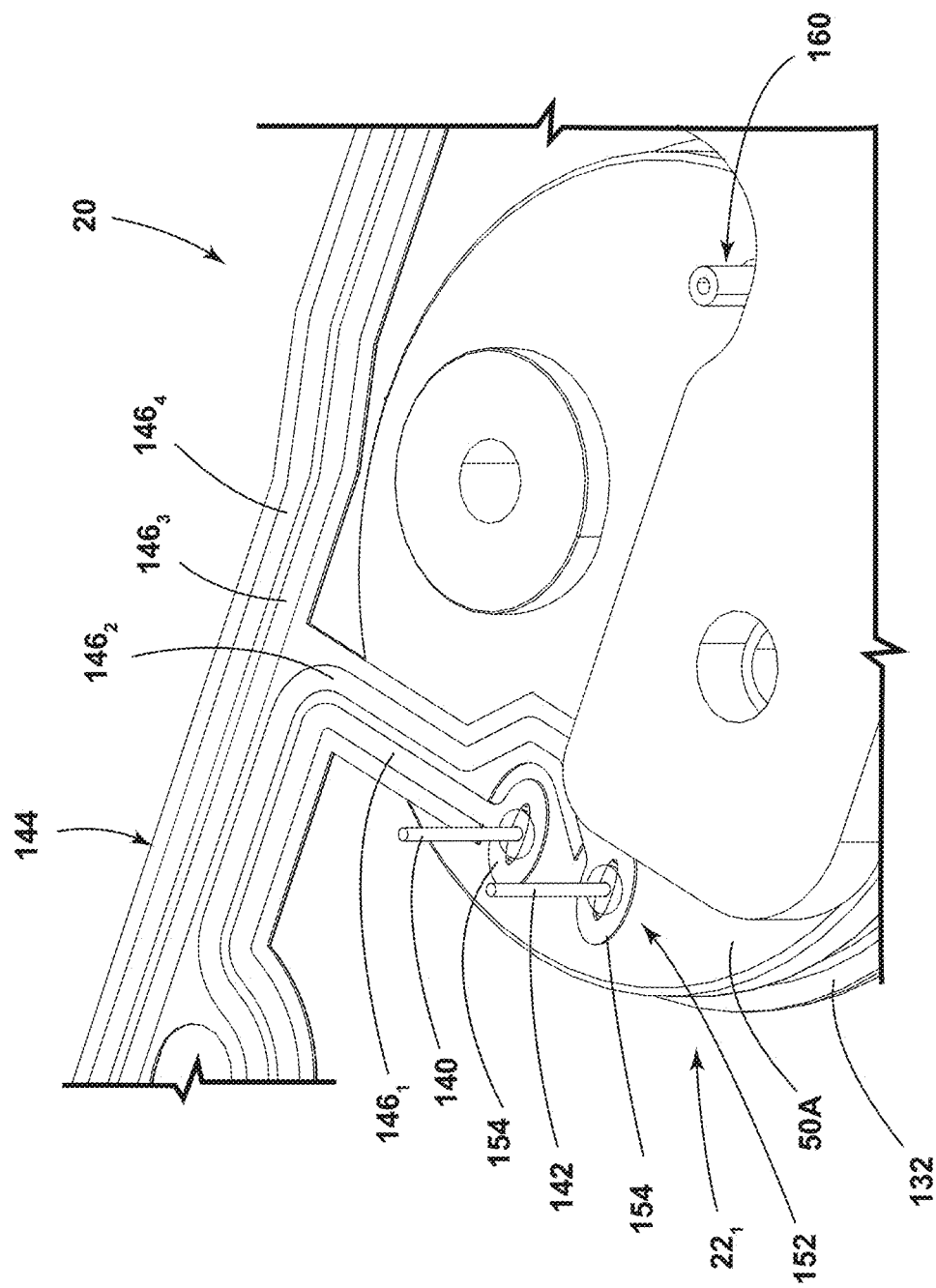
FIG. 8 is a partial perspective view generally illustrating an embodiment of an electrical assembly in which a bracket, a bus bar assembly, and a cooling member are hidden.

In some example configurations, the controller 110 may be electrically connected to a first control terminal 140 and/or a second control terminal 142 of a contactor 22 that may be connected (e.g., electrically) to an actuator 58 of the contactor 22 (see, e.g., FIG. 8). For example and without limitation, the controller 110 may be connected to the control terminals 140, 142 via a flexible circuit/ribbon cable 144 that may include a conductor 146 (e.g., conductors $146_{1-8}$) for each control terminal 140, 142. The flexible circuit 144 may include a first segment 148 that may be connected to an electrical connector 150 that may be connected to the bracket 26 (see, e.g., FIGS. 5 and 9).

Figure 9:
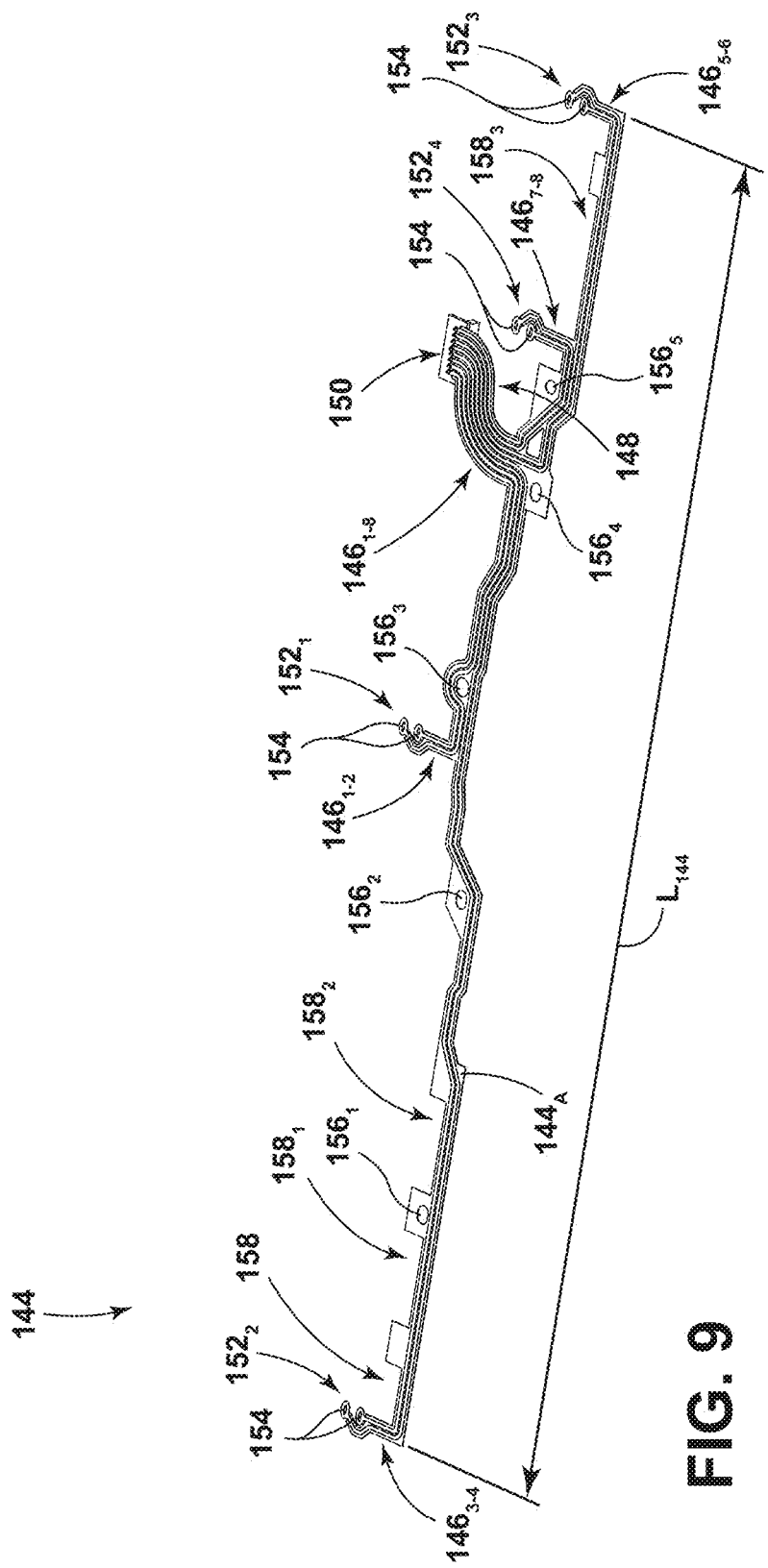
FIG. 9 is perspective view generally illustrating an embodiment of a flexible circuit.
Figure 10A:
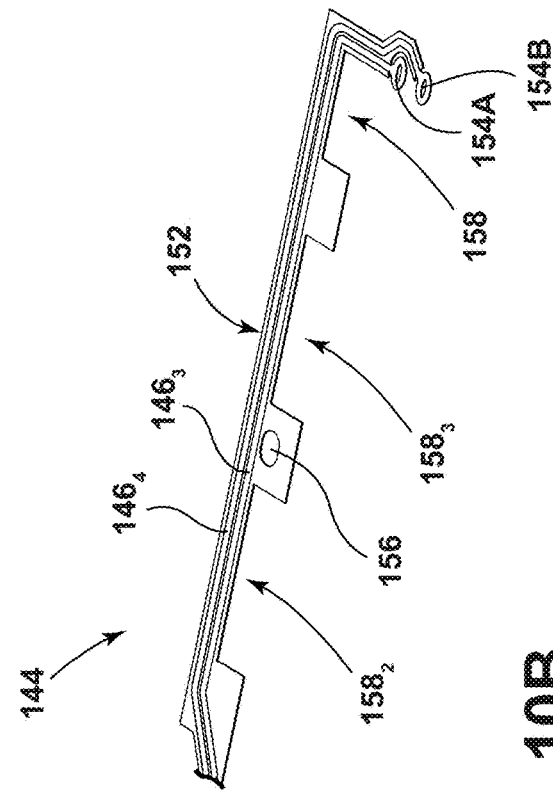
FIGS. 10A-10C are partial perspective views generally illustrating embodiments of flexible circuits.
Figure 10B:
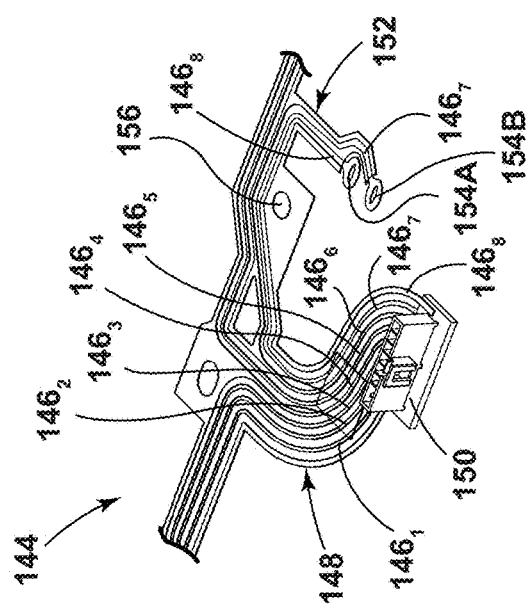
Figure 10C:
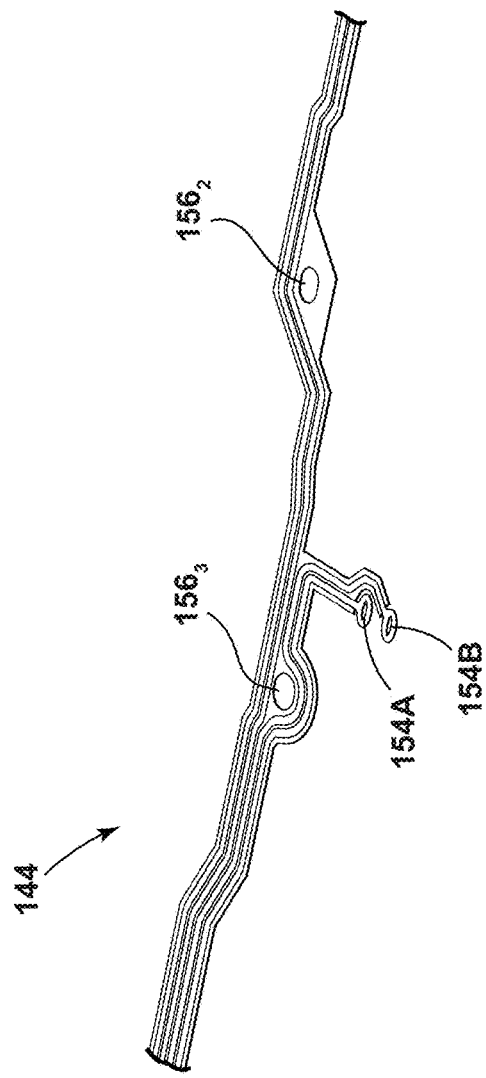

With embodiments, a flexible circuit 144 may include one or more second segments 152 (e.g., second segments $152_1$, $152_2$, $152_3$, $152_4$) that may be connected to respective contactors 22 (see, e.g., FIGS. 5, 8, and 9). A second segment 152 may include a pair of conductors 146 (e.g., conductors $146_1$ and $146_2$) connected to the control terminals 140, 142. The pair of conductors 146 may, for example, include eyelets 154 (e.g., eyelets 154A and 154B) that may be disposed over/around the control terminals 140, 142 (e.g., the control terminals 140, 142 may be inserted into the eyelets 154). The eyelets 154 may be integrally formed with respective conductors 46 (e.g., without a separate connecting process, such as crimping or soldering) as part of the flexible circuit 144 (see, e.g., FIGS. 9 and 10A-10C). In some examples, in an assembled configuration, a contactor 22 may include a top cover 162 that may provide a protective covering of the eyelets 154 and/or the control terminals 140, 142 (see, e.g., FIG. 4). The top cover 162 may, for example, include an electrically insulating and/or thermally conductive material, such as a polymer and/or plastic.

With embodiments, a controller 110 may, for example, be electrically connected to the flexible circuit 144 via an electrical connector 150. The electrical connector 150 may include a terminal/pin for each conductor 146 of the flexible circuit 144 (e.g., conductors $146_{1-8}$). For example and without limitation, a single electrical connector 150 (e.g., an external electrical connector) may provide/facilitate electrical connections with a plurality of contactors 22. In some configurations, a first segment 148 of the flexible circuit 144 may include more conductors 146 than a second segment 152 of the flexible circuit 144 (see, e.g., FIGS. 9 and 10A).

In embodiments, such as generally illustrated in FIGS. d9 and 10A-C, a flexible circuit 144 may include one or more of a variety of shapes, sizes, materials, and/or configurations. For example and without limitation, the flexible circuit 144 may include a monolithic (e.g., single, unitary) construct. Additionally or alternatively, the flexible circuit 144 may include one or more material layers 144A that may be integrally formed on and/or around each other and/or the one or more conductors 146. The one or more layers may include one or a combination of an insulating layer, an adhesive layer, and/or a protective coating layer, among others.

In some example configurations, a flexible circuit 144 may include a thin configuration. For example, a flexible circuit 144 may include a thickness $T_{144}$ that is less than its width $W_{144}$ (see, e.g., FIG. 7). In some examples, a flexible circuit 144 may include a thickness $T_{144}$ that is equal to or less than approximately $1/10^{th}$ its width $W_{144}$. In some other examples, a flexible circuit 144 may include a thickness $T_{144}$ that is greater than approximately $1/10^{th}$ its width $W_{144}$. In some embodiments, such as the example embodiment of FIG. 9, a length $L_{144}$ of a flexible circuit 144 may be significantly longer than its width $W_{144}$ and/or its thickness $T_{144}$. For example and without limitation, the length $L_{144}$ may be at least five or ten (or more or fewer) times longer than its width $W_{144}$ and/or may be at least fifty or one hundred (or more or fewer) times longer than its thickness $T_{144}$.

With embodiments, such as generally illustrated in FIGS. 8 and 9, a flexible circuit 144 may be substantially planar.

For example, some, most, and/or substantially all of a flexible circuit 144 may extend along a single plane. In some example configurations, the flexible circuit 144 may be configured such that at least a portion of a second segment 152 of the flexible circuit 144 is arranged to contact and/or extend along at least a portion of a first surface 50A of a respective contactor 22 (see, e.g., FIG. 8). With some configurations, a plurality of conductors 46 may be aligned in a common plane and/or may be separated by electrically insulating material. Adjacent conductors 46 may be separated by the same material/layers 144A (e.g., electrically insulating material/layer(s)) that may be formed directly on and/or around some or all of the conductors 46.

In some example configurations, a flexible circuit 144 may, for example, be disposed at least partially between a bus bar assembly 24 and a bracket 26 (see, e.g., FIG. 7). In embodiments, such as generally illustrated in FIGS. 5-7, a flexible circuit 144 may be disposed on, and/or extend along a surface $S_{26}$ of a bracket 26, such as to some or each of the one or more contactors 22. In some examples, the surface $S_{26}$ of the bracket 26 may include a recess 159 and at least a portion of the flexible circuit 144 may be disposed within the recess 159 (see, e.g., FIG. 6). In some examples, at least a portion of a bus bar assembly 24 may be disposed in the recess 159 such that at least a portion of the flexible circuit 144 is disposed between the bus bar assembly 24 and the bracket 26. The recess 159 may, for example, include a generally U-shaped configuration that may open upward.

In some example configurations, some, most, and/or substantially all of a flexible circuit 144 may be disposed between one or more bus bars 60, 62 and a bracket 26. The bus bars 60, 62 may be disposed at a relatively small distance $D_1$ from a surface $S_{26}$ of the bracket 26 (see, e.g., FIG. 6). In some examples, the distance $D_1$ may be sufficient for the flexible circuit 144 to fit within but may be insufficient for alternatives to the flexible circuit 144 (e.g., individual wires, electrical connectors, and/or other traditional types of cables/wires, among others) to fit within. The distance D1 may, at least in some configurations, be dictated by the height of a ledge 174 (e.g., a step, a lip, among others) of the bracket 26 that may extend into the recess 159. The ledge 174 may extend into the recess 159 such that the width of the recess 159 is reduced and a bus bar (e.g., bus bar 62) is disposed at least partially on the ledge 174 and at the distance $D_1$ from the surface $S_{26}$.

With embodiments, such as generally illustrated in FIGS. 5 and 10A-10C, a flexible circuit 144 may include one or more through holes 156 (e.g., through holes $156_1$, $156_2$, $156_3$, $156_4$, $156_5$) and/or one or more voids 158 (e.g., voids $158_1$, $158_2$, $158_3$) that may be configured to receive a corresponding portion of a bracket 26. In some example configurations, a respective fastener (not depicted) may be disposed within at least some and/or all of the one or more through holes 156 and may be received by the bracket 26. For example and without limitation, the one or more through holes 156 and/or the one or more voids 158 may, at least in part, help secure the flexible circuit 144 with the bracket 26 (e.g., restrict and/or prevent movement of the flexible circuit 144 relative to the bracket 26). In some examples, the through holes 156 and/or the voids 158 may be arranged to aid in the process of assembling the flexible circuit 144 with the bracket 26. For example, the through holes 156 and/or the voids 158 may function as a poka-yoke feature that may, at least in part, help ensure that the flexible circuit 144 is properly aligned and/or assembled with the bracket 26.

In embodiments, such as generally illustrated in FIG. 8, a contactor 22 may include a vent 160 (e.g., a fluid vent). The vent 160 may be configured to limit fluid pressure differentials between the inside and the outside of a contactor 22. For example and without limitation, if the temperature inside a contactor 22 increases, the air pressure inside the contactor may increase. The vent 160 may allow air to flow out of the contactor 22 to decrease the internal air pressure, such as if the pressure exceeds a pressure threshold. Additionally or alternatively, the vent 160 may allow air to flow into of the contactor 22 to increase the internal air pressure, such as if the pressure is below a second pressure threshold.

With embodiments, such as generally illustrated in FIG. 4, a contactor 22 may include a top cover 162. The top cover 162 may at least partially cover a first control terminal 140, a second control terminal 142, and/or a vent 160. For example and without limitation, a top cover 162 may include a first recess 164 that may at least partially cover and/or receive a first control terminal 140 and/or a second control terminal 142. Additionally or alternatively, a top cover 162 may include a second recess 166 that may at least partially cover and/or receive a vent 160. The top cover 162 may include an insulating wall 168 that may extend at least partially between a first terminal 52 and a second terminal 54 and/or between the first recess 164 and the second recess 166. For example and without limitation, a top cover 162 may be substantially planar and may extend from the first recess 164 to the second recess 166 such that the top cover 162 separates and electrically insulates the first terminal 52 and the second terminal 54. The top cover 162 may include an electrically insulating material that may or may not be thermally conductive.

In embodiments, the electrical loads 170 may include one or more complementary loads, which may include loads being configured such that only one (e.g., of a pair or set) would be expected to be activated/operated at any given time. For example and without limitation, a first electrical load $170_1$ may include an air conditioner (e.g., to provide cooled air, such as in a vehicle) and/or a second electrical load $170_2$ may include a heater (e.g., to provide warmed air, such as in the vehicle).

Figure 11:
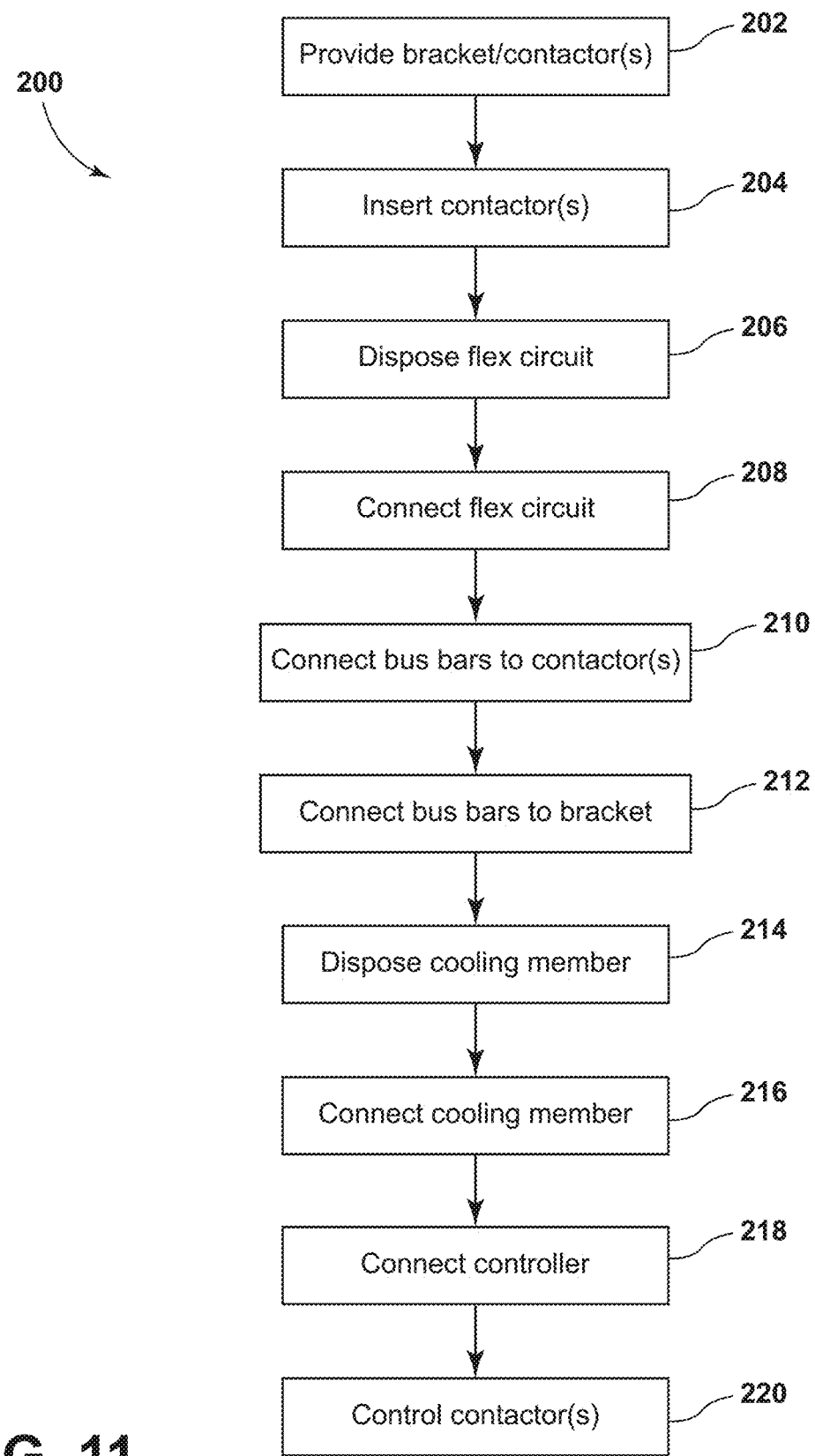
FIG. 11 is a flow diagram generally illustrating an embodiment of a method of assembling an electrical assembly.

With embodiments, such as generally illustrated in FIG. 11, a method 200 of assembling an electrical assembly 20 may include providing a bracket 26 and/or one or more contactors 22 (block 202). The one or more contactors 22 may be inserted into the bracket 26 (block 204), such as into respective apertures 100 until flanges 132 of the one or more contactors 22 contact lips 130 of the apertures 100. Inserting the one or more contactors 22 into the bracket 26 may not include fixing the one or more contactors 22 directly to the bracket 26. A flexible circuit 144 may be disposed on and/or in the bracket 26 (block 206). The flexible circuit 144 may be electrically connected to one or more contactors 22, such as to control terminals 140, 142, and/or to an electrical connector 150 (block 208). Electrically connecting the flexible circuit 144 to one or more contactors 22 may, for example, include disposing eyelets 154 (e.g., integrated eyelets) of the flexible circuit 144 on control terminals 140, 142 and/or soldering the eyelets 154 with the control terminals 140, 142.

In embodiments, the method 200 may include connecting a bus bar assembly 24 with one or more contactors 22 (block 210). Connecting the bus bar assembly 24 with the one or more contactors 22 may include disposing one or more bus bars 60, 62 on and/or in the bracket 26, and/or may include fastening (e.g., fixing) the one or more bus bars 60, 62 with terminals 52, 54 of the contactor(s) 22, such as via one or more first fasteners 120. Disposing the one or more bus bars 60, 62 on and/or in the bracket 26 may include disposing the one or more bus bars 60, 62 over portions of the flexible circuit 144 such that portions of the flexible circuit 144 are disposed directly between the bracket 26 and the bus bars 60, 62. The one or more bus bars 60, 62 may be disposed in contact with the one or more contactors 22.

With embodiments, the method 200 may include connecting the bus bar assembly 24 with the bracket 26, which may include fastening (e.g., fixing) the bus bar assembly 24 with the bracket 26 via one or more second fasteners 122 (block 212). The second fasteners 122 may, for example and without limitation, be inserted/screwed into the bus bar assembly 24 and then down into the bracket 26. Connecting the bus bar assembly 24 with the bracket 26 may (e.g., indirectly) connect the one or more contactors 22 with the bracket 26. The method 200 may include disposing the cooling member 28 on the bracket 26 (block 214), which may include inserting portions of the one or more contactors 22, the bus bar assembly 24, the bracket 26, and/or the flexible circuit 144 into the cooling member 28, such as into a second recess 78. The method 200 may include connecting the cooling member 28 with the bracket 26 (block 216), which may include fastening (e.g., fixing) the cooling member 28 with the bracket 26 via one or more third fasteners 124. For example and without limitation, the one or more third fasteners 124 may be inserted into the bracket 26 and then up into the cooling member 28.

In embodiments, a method 200 may include connecting (e.g., electrically) the flexible circuit 144 with the controller 110 (block 218). The method 200 may include controlling operation of one or more contactors 22 via the controller 110 (block 220). For example, the controller 110 may provide one or more control signals to the flexible circuit 144 and the flexible circuit may provide the one or more control signals to a respective control terminal 140, 142 of each of the one or more contactors 22, which may open and/or close the contactor to selective provide power from a power source 40 to one or more loads 170, 172.

With embodiments, a bracket 26, a first portion 72 of a cooling member 28, and/or a second portion 74 of cooling member 28 may, for example, be formed as monolithic (e.g., single, unitary) components. For example and without limitation, the bracket 26 may be formed as monolithic plastic component, and/or the first portion 72 may be formed as monolithic metal (e.g., aluminum) component.

In examples, a controller (e.g., controller 110) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory (e.g., a non-transitory computer-readable storage medium), and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. The use of "e.g." and "such as" in the specification are to be construed broadly and are used to provide non-limiting examples of embodiments of the disclosure, and the disclosure is not limited to such examples or such types of examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. An electrical assembly, comprising:
a contactor;
a bus bar electrically connected to the contactor;
a bracket connected to the bus bar;
a flexible circuit electrically connected to the contactor,
a cooling member connected to the bracket, the flexible circuit is disposed substantially between the bracket and the cooling member, and wherein the bracket includes a recess; the bus bar is disposed at least partially in the recess; and at least a portion of the flexible circuit is disposed in the recess between the bus bar and a surface of the bracket.

2. The electrical assembly of claim 1, wherein the flexible circuit is disposed on and along a surface of the bracket.

3. The electrical assembly of claim 1, including an electronic controller configured to control the contactor to selectively provide power from a power source to one or more electrical loads.

4. The electrical assembly of claim 3, wherein the contactor includes a first control terminal and a second control terminal.

5. The electrical assembly of claim 4, wherein the flexible circuit includes one or more conductors.

6. The electrical assembly of claim 5, wherein the flexible circuit includes a first segment electrically connected to the electronic controller and a second segment electrically connected to the contactor.

7. The electrical assembly of claim 6, wherein the first segment of the flexible circuit includes an electrical connector having a respective terminal for each of the one or more conductors.

8. The electrical assembly of claim 7, wherein the second segment of the flexible circuit includes a pair of integrated eyelets.

9. The electrical assembly of claim 8, wherein the pair of integrated eyelets includes a first eyelet integrally formed with a first conductor of the one or more conductors and a second eyelet integrally formed with a second conductor of the one or more conductors;
the first eyelet is disposed around and connected to the first control terminal of the contactor; and
the second eyelet is disposed around and connected to the second control terminal of the contactor.

10. The electrical assembly of claim 1, wherein the flexible circuit includes a length, a width, and a thickness;
the width is at least five times the thickness; and
the length is at least five times the width.

11. The electrical assembly of claim 1, wherein the contactor is fixed directly to and in contact with the bus bar;
the bus bar is fixed directly to and in contact with the bracket; and
the bracket is fixed directly to and in contact with the cooling member.

12. The electrical assembly of claim 1, wherein the cooling member includes an at least partially hollow body configured to receive a cooling fluid.

13. A method of assembling the electrical assembly of claim 1, the method comprising:
disposing the flexible circuit at least partially on and/or in the bracket;
inserting one or more contactors, including the contactor, into the bracket;
electrically connecting the bus bar with the one or more contactors;
connecting the bus bar with the bracket;
electrically connecting the flexible circuit to the one or more contactors;
disposing the cooling member on or about the bracket; and
connecting the cooling member with the bracket.

14. The method of claim 13, wherein the bus bar is connected with the one or more contactors such that portions of the flexible circuit are disposed directly between the bus bar and the bracket.

15. The method of claim 13, wherein disposing the cooling member on the bracket includes inserting the bracket, the flexible circuit, the bus bar, and the one or more contactors at least partially into a recess of the cooling member.

16. The method of claim 13, including electrically connecting the flexible circuit to a controller configured to control the one or more contactors to selectively provide power from a power source to one or more electrical loads.

17. The method of claim 16, including controlling operation of the one or more contactors via the controller providing one or more control signals via the flexible circuit to the one or more contactors.

18. The method of claim 13, wherein the flexible circuit is monolithic and connecting the flexible circuit to the one or more contactors includes connecting a pair of integrated eyelets of the flexible circuit to respective control terminals of the one or more contactors.

* * * * *